United States Patent
Lee et al.

(10) Patent No.: US 9,620,194 B1
(45) Date of Patent: Apr. 11, 2017

(54) STACKED MEMORY DEVICE HAVING SERIAL TO PARALLEL ADDRESS CONVERSION, REFRESH CONTROL UNIT, AND PIPE CONTROL UNIT

(71) Applicant: SK hynix Inc., Gyeonggi-do (KR)

(72) Inventors: Hyun-Sung Lee, Gyeonggi-do (KR); Chun-Seok Jeong, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/153,383

(22) Filed: May 12, 2016

(30) Foreign Application Priority Data

Nov. 23, 2015 (KR) .................. 10-2015-0163773

(51) Int. Cl.
*G11C 7/00* (2006.01)
*G11C 11/406* (2006.01)

(52) U.S. Cl.
CPC ...... *G11C 11/40615* (2013.01); *G11C 11/406* (2013.01); *G11C 11/40618* (2013.01)

(58) Field of Classification Search
CPC ............ G11C 11/406; G11C 11/40615; G11C 7/1039; G11C 8/18; G11C 11/40618; G11C 7/1051

USPC ....................... 365/222, 219, 51, 230.01, 200
See application file for complete search history.

(56) References Cited

U.S. PATENT DOCUMENTS 8,988,962 B2* 3/2015 Shin .................. G11C 11/402
365/203

FOREIGN PATENT DOCUMENTS

KR 1020070023973 3/2007
KR 1020110097478 8/2011

* cited by examiner

*Primary Examiner* — David Lam
(74) *Attorney, Agent, or Firm* — IP & T Group LLP (57) ABSTRACT

Provided is a stacked memory device including a base die and a plurality of core dies. The base die may include: a weak cell address storage unit for storing weak cell addresses; a serialization unit for selecting at least one of the weak cell addresses as a target weak cell address, converting the selected target weak cell address into a serial weak cell address, and outputting a strobe signal synchronized with the serial weak cell address; a deserialization unit for storing the serial weak cell address based on the strobe signal, and converting the stored address into a parallel weak cell address based on a refresh end signal; and a refresh control unit for selecting the parallel weak cell address or a refresh address generated based on a refresh signal, and outputting a target address.

20 Claims, 8 Drawing Sheets

STACKED MEMORY DEVICE HAVING SERIAL TO PARALLEL ADDRESS CONVERSION, REFRESH CONTROL UNIT, AND PIPE CONTROL UNIT

CROSS-REFERENCE TO RELATED APPLICATIONS

The present application claims priority of Korean Patent Application No. 10-2015-0163773, filed on Nov. 23, 2015, which is incorporated herein by reference in its entirety.

BACKGROUND

1. Field

Exemplary embodiments of the present invention relate to a semiconductor design technology, and more particularly, to a stacked memory device suitable for performing a refresh operation.

2. Description of the Related Art

In general, volatile memory devices, such as DRAM or DDR SDRAM perform a refresh operation periodically to prevent data stored in a memory cell from being lost.

The refresh operation may be performed in an auto-refresh mode or a self-refresh mode. In the auto-refresh mode, a memory device performs a refresh operation in response to a refresh command applied from an external source during a normal operation of the memory device. In the self-refresh mode, the memory device performs a refresh operation in response to a refresh command signal that is internally generated, while the memory device is not operated (e.g., in a power-down mode).

When the refresh characteristics of a few cells are deteriorated even though the overall refresh characteristic of DRAM is not affected by the deterioration, the overall refresh performance may be degraded by the few cells. Various methods have been proposed for refreshing one or more cells having a shorter data retention time than the refresh cycle tREF based on the design specification of the DRAM. Such cells are referred to hereinafter as weak cells.

A two-dimensional (2D) structure, in which a plurality of semiconductor chips having integrated circuits are disposed on a printed circuit board (PCB) using wires or bumps, has been used as a conventional packaging technology. With the rapid development of the semiconductor memory technology, the packaging technology for semiconductor integrated devices has required high integration and high performance. Thus, a variety of technologies have been developed for obtaining a three-dimensional (3D) structure, in which a plurality of semiconductor chips are vertically stacked.

In a stacked memory device having a three-dimensional structure, a plurality of memory chips may be vertically stacked. The semiconductor chips stacked in the vertical direction are mounted on a substrate for a semiconductor package, and the semiconductor chips may be coupled electrically to each other through a plurality of through-chip vias, for example, through-silicon vias (TSVs).

Such stacked memory devices also require a method for refreshing weak cells.

SUMMARY

Various embodiments of the present invention are directed to a stacked memory device including a base die and a plurality of core dies, which are stacked, wherein one or more circuits for storing weak cell addresses are disposed in an outer region of the base die, instead of a center region of the base die.

Also, various embodiments are directed to a stacked memory device including a base die and a plurality of core dies, which are stacked, and transmitting signals between a center region and an outer region of the base die through a serialization-deserialization circuit.

In an embodiment, there is provided a stacked memory device including a base die and a plurality of core dies. The base die may include: a weak cell address storage unit suitable for storing weak cell addresses; a serialization unit suitable for selecting at least one of the weak cell addresses provided from the weak cell address storage unit as a target weak cell address, converting the selected target weak cell address into a serial weak cell address, and outputting a strobe signal synchronized with the serial weak cell address, based on a weak cell refresh mode signal and a pipe control signal; a deserialization unit suitable for storing the serial weak cell address based on the strobe signal, and converting the stored address into a parallel weak cell address based on a refresh end signal; a refresh control unit suitable for selecting the parallel weak cell address or a refresh address generated based on a refresh signal, and outputting a target address for a refresh operation; and a pipe control unit suitable for generating the pipe control signal which is activated a predetermined number of times in a row, based on the refresh signal.

In an embodiment, there is provided a stacked memory device including a base die and a plurality of core dies. The base die may include: a weak cell address storage unit suitable for storing weak cell address information; a pipe control unit suitable for generating a pipe control signal using piled refresh signals for a piled refresh operation; a serialization unit suitable for converting a weak cell address stored in the weak cell address storage unit into a serial weak cell address, and outputting a strobe signal synchronized with the serial weak cell address, based on the pipe control signal; a deserialization unit suitable for storing the serial weak cell address based on the strobe signal, and converting the stored address into a parallel weak cell address based on a refresh end signal; and a refresh control unit suitable for outputting the parallel weak cell address or a refresh address as a target address for a refresh operation.

In an embodiment, a memory system may include: a controller die; and a stacked memory device comprising a base die and a plurality of core dies. The base die may include: a weak cell address storage unit suitable for storing weak cell address information; a serialization unit suitable for converting a weak cell address stored in the weak cell address storage unit into a serial weak cell address, and outputting a strobe signal synchronized with the serial weak cell address, based on a pipe control signal which is sequentially activated based on a refresh signal; a deserialization unit suitable for storing the serial weak cell address in response to the strobe signal, and converting the stored address into a parallel weak cell address based on a refresh end signal; and a refresh control unit suitable for outputting the parallel weak cell address or a refresh address as a target address for a refresh operation.

The pipe control unit, the deserialization unit, and the refresh control unit may be disposed in a center region of the base die, and the weak cell address storage unit and the serialization unit are disposed in an outer region of the base die. The base die may further comprise a pipe control unit suitable for generating the pipe control signal using piled refresh signals for a piled refresh operation, and the pipe control unit may be disposed in the center region of the base die. The serialization unit may comprise a plurality of pipe latches suitable for storing a weak cell address selected based on a serial pipe input control signal which is generated based on the pipe control signal, and outputting the stored address as the serial weak cell address in response to a plurality of serial pipe output control signals which are generated based on the pipe control signal. The deserialization unit may comprise a plurality of pipe latches suitable for storing the serial weak cell address in response to a plurality of parallel pipe input control signals which are generated based on the strobe signal, and outputting the parallel weak cell address in response to the refresh end signal.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the present invention to those skilled in the art. Throughout the disclosure, like reference numerals refer to like parts throughout the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

A semiconductor memory system according to an embodiment of the present invention may be implemented in the form of a system in package (SIP), a multi-chip package (MCP), or a system on chip (SoC), or implemented in the form of a package on package (PoP) which includes a plurality of packages.

Figure 1:
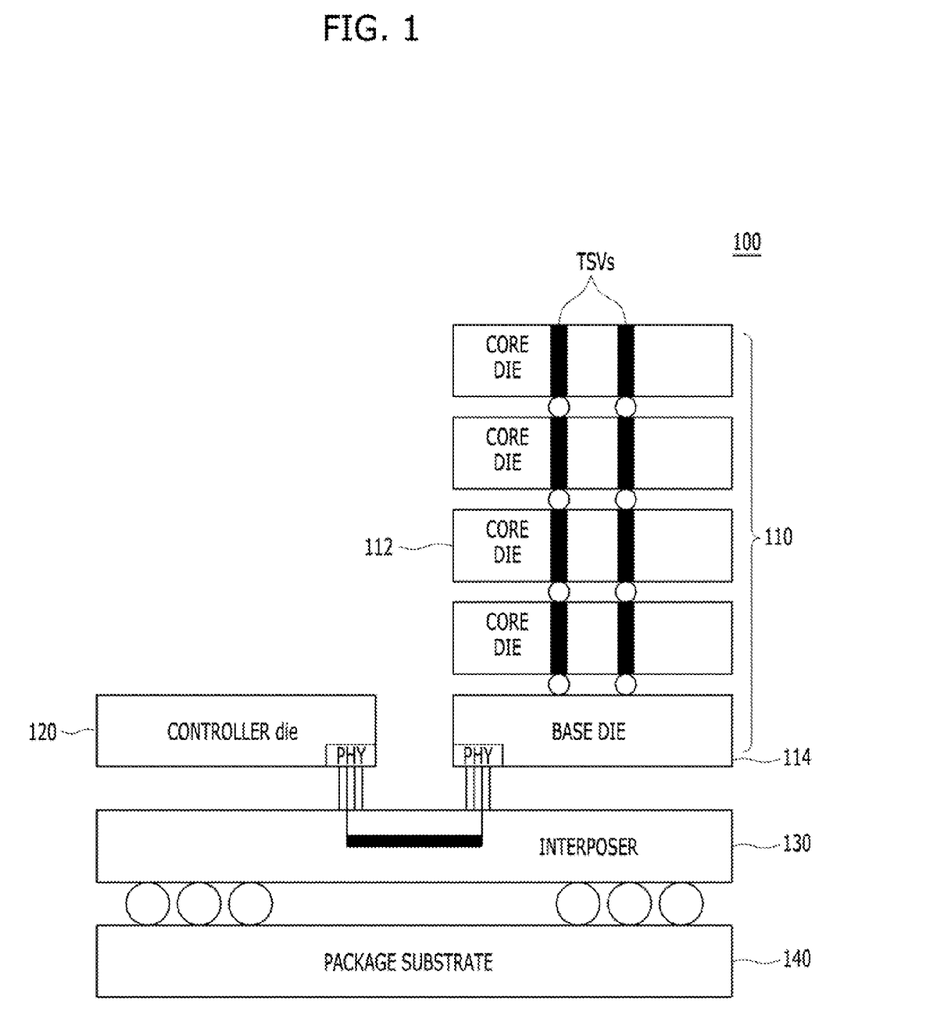
FIG. 1 is a diagram illustrating a semiconductor memory system, according to an embodiment of the present invention.

Referring now to FIG. 1, a semiconductor memory system 100 is provided, according to an embodiment of the present invention.

The memory system 100 may include a stacked memory device 110, a controller die 120, an interposer 130, and a package substrate 140.

The interposer 130 may be disposed on the package substrate 140.

The stacked memory device 110 and the controller die 120 may be disposed on the interposer 130.

Physical regions PHYs included in the stacked memory device 110 and the controller die 120 may be coupled to each other through the interposer 130.

Along with the controller 120, the interposer 130, and the package substrate 140, the stacked memory device 110 may form a high bandwidth memory (HBM). The stacked memory device 110 may include a plurality of dies (i.e., chips) that are stacked and electrically coupled through TSVs so that the number of input/output units is increased to improve the bandwidth.

The stacked memory device 110 dies may include a base die (i.e., a logic die) 114 and a plurality of core dies (i.e., DRAM dies) 112. The core dies 112 may be stacked over the base die 114, and coupled to each other through a plurality of TSVs, for example, two TSVs as illustrated in FIG. 1.

The core die 112 may have a core region arranged therein. The core region may include a plurality of memory cells for storing data and one or more circuits suitable for performing at least one of a read and write operations of the memory cells.

The base die 114 may include one or more circuits for interfacing the core dies 112 and the controller die 120, and thus perform various functions of the semiconductor memory system, for example, a power management function for the memory cells, a memory management function, such as a refresh function, or a timing control function of controlling timings between the core dies 112 and the controller die 120. The controller die 120 may be or include at least one of a central processing unit (CPU) die, a graphic process unit (GPU) die, a system on chip (SOC) die and the like.

For improving the integration degree of the core region, a plurality of memory cells and any necessary circuits such as, for example, a sense amplifier, and a row line driver, which need to be arranged adjacent to the memory cells for the core operations of the memory cells, may be arranged in the core die 112, whereas a peripheral circuit region including other circuits, for example, circuits for IO operation of the memory device may be arranged in the base die 114.

The base die 114 includes a center region and an outer region. The center region of the base die 114 may include circuits for communicating with the core dies 112. The peripheral circuit region of the base die 114 may be arranged in the center region of the base die 114.

As the number of circuits to be arranged in the center region of the base die 114 increases, the circuits to be arranged in the center region of the base die 114 needs to be distributed to the outer region of the base die 114. However, when the circuit are distributed to the outer region, signals lines for transmitting related signals between the outer region and the center region may be required. Furthermore, the signal lines may be lengthened according to the arrangement interval between the circuits.

Various embodiments of the present invention provide an architecture in which a circuit for refreshing a weak cell is arranged in the outer region instead of the center region of the base die 114. Such architecture is advantageous in that it may reduce the number of signal transmission lines required between the outer region and the center region.

Figure 2:
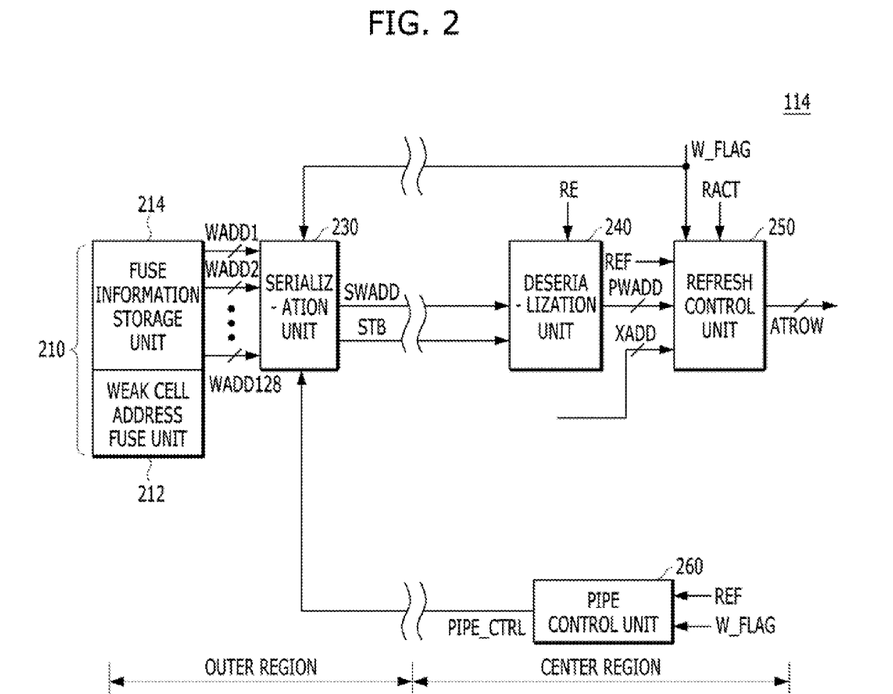
FIG. 2 is a detailed diagram of an example for a base die shown in FIG. 1.

Referring now to FIG. 2, an example of the base die 114 shown in FIG. 1 will be described, according to an embodiment of the invention. FIG. 2 also shows a circuit for refreshing a weak cell.

Referring to FIG. 2, the base die 114 of the stacked memory device may include a weak cell address storage unit 210, a serialization unit 230, a deserialization unit 240, a refresh control unit 250, and a pipe control unit 260.

The weak cell address storage unit 210 may store the addresses of weak cells having a shorter data retention time than normal cells among the plurality of memory cells of the semiconductor device. The addresses of weak cells are also referred to hereinafter as weak cell address information.

More specifically, the weak cell address storage unit 210 may include a weak cell address fuse unit 212 and a fuse information storage unit 214.

The weak cell address fuse unit 212 may include a plurality of fuses (not illustrated) for programming the weak cell address information. The weak cell address fuse unit 212 may include an array E-fuse (ARE) or a nonvolatile memory device. The weak cell address fuse unit 212 may output the programmed weak cell address information to the fuse information storage unit 214, during a boot-up operation that is included in a power-up sequence of the stacked memory device. The fuse information storage unit 214 may store the weak cell address information provided from the weak cell address fuse unit 212 as weak cell addresses WADD1 to WADD128, and output the weak cell addresses WADD1 to WADD128 to the serialization unit 230. For convenience of description, FIG. 2 illustrates that 128 weak cell addresses WADD1 to WADD128 each having N bits are outputted to the serialization unit 230. The N is a natural number greater than 2.

The serialization unit 230 may select at least one of the weak cell addresses WADD1 to WADD28 provided from the weak cell address storage unit 210 as a target weak cell address WADD, and convert the selected target weak cell address WADD into a serial weak cell address SWADD, in response to a weak cell refresh mode signal W_FLAG and a pipe control signal PIPE_CTRL. Furthermore, the serialization unit 230 may output a strobe signal STB synchronized with the serial weak cell address SWADD in response to the pipe control signal PIPE_CTRL. The serialization unit 230 may include a plurality of pipe latches which store the selected target weak cell address WADD according to a serial pipe input control signal (see SPIN of FIG. 4a) which is generated based on the pipe control signal PIPE_CTRL, and output the stored address as the serial weak cell address SWADD in response to a plurality of serial pipe output control signals (see SPOUT<0:6> of FIG. 3) which are generated based on the pipe control signal PIPE_CTRL.

The deserialization unit 240 may convert the serial weak cell address SWADD into a parallel weak cell address PWADD in response to the strobe signal STB and a refresh end signal RE. The deserialization unit 240 may include a plurality of pipe latches for storing the serial weak cell address SWADD in response to a plurality of parallel pipe input control signals (see PIN<0:6> of FIG. 6) which are generated based on the strobe signal STB. The deserialization unit 240 may output the parallel weak cell address PWADD in response to the refresh end signal RE.

The refresh control unit 250 may select at least one of the parallel weak cell address PWADD, a refresh address (see REF_ADD of FIG. 8) generated based on the refresh signal REF, and a row address for a normal operation, and output the selected address as a target row address ATROW, in response to the weak cell refresh mode signal W_FLAG, a refresh signal REF, and a word line active command RACT. More specifically, the refresh control unit 250 may output the parallel weak cell address PWADD as the target row address ATROW when the refresh signal REF is activated in a state where the weak cell refresh mode signal W_FLAG is activated, output the refresh address REF_ADD as the target row address ATROW when the refresh signal REF is activated in a state where the weak cell refresh mode signal W_FLAG is deactivated, and output the row address XADD as the target row address ATROW when the word line active command RACT is activated.

The target row address ATROW may be provided to a row decoder (not illustrated), and allow the memory cell array to perform a refresh operation. The row decoder may be arranged in the same center region of the core die 112 or the base die 114, according to the memory specification. For reference, the word line active command RACT may be activated in response to an active command ACT (not illustrated) which enables a word line in the memory cell array region. The word line active command RACT may be deactivated in response to a precharge command PCG (not illustrated) which disables a word line.

The pipe control unit 260 may generate the pipe control signal PIPE_CTRL which is activated a predetermined number of times in a row, in response to the refresh signal REF. More specifically, the pipe control unit 260 may output the pipe control signal PIPE_CTRL which is activated a predetermined number of times in a row whenever the refresh signal REF is inputted, during the weak cell refresh mode in which the weak cell refresh mode signal W_FLAG is activated. For reference, the pipe control signal PIPE_CTRL may be activated a predetermined number of times in a row, which is greater by one than the bit number N of the target weak cell address WADD, that is, (N+1) times.

A piled refresh scheme may be used to reduce the peak current during a refresh operation. The piled refresh scheme may not activate all banks at the same time, and may perform the refresh operations of the respective banks at different timings on a basis of a predetermined number of banks. In another embodiment of the present invention, a memory device which performs the piled refresh scheme may generate the pipe control signal PIPE_CTRL using piled refresh signals which are sequentially activated to perform piled refresh operations.

The weak cell address fuse unit 212 and the fuse information storage unit 214 of the weak cell address storage unit 210 occupy a relatively large area. Hence, it may be difficult to arrange the weak cell address fuse unit 212 and the fuse information storage unit 214 in the center region of the base die 114. In FIG. 2, the weak cell address storage unit 210 and the serialization unit 230 may be arranged in the outer region of the base die 114, and the deserialization unit 240, the refresh control unit 250, and the pipe control unit 260 may be arranged in the center region of the base die 114.

Thus, in an embodiment of the present invention, the weak cell address storage unit 210 may be arranged in the outer region of the base die 114, and a weak cell address which is a parallel signal may be converted into a serial signal and transmitted to the center region of the base die 114 through a serial signal line, which makes it possible to minimize the number of signal lines between the center region and the outer region.

Figure 3:
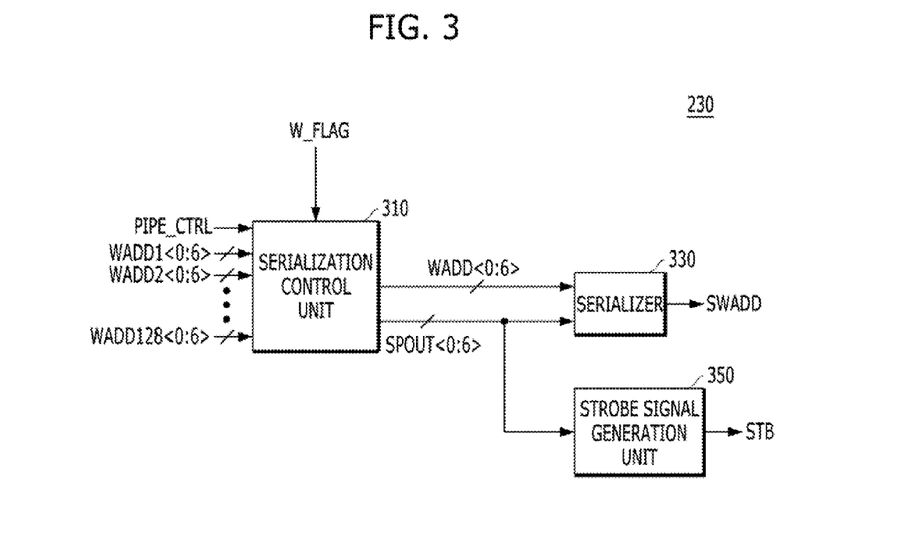
FIG. 3 is a detailed diagram illustrating a serialization unit shown in FIG. 2.

FIG. 3 is a detailed diagram illustrating the serialization unit 230 shown in FIG. 2. It is assumed that N is set to 7, for convenience of description.

Referring to FIG. 3, the serialization unit 230 may include a serialization control unit 310, a serializer 330, and a strobe signal generation unit 350.

The serialization control unit 310 may receive the pipe control signal PIPE_CTRL which is activated a predetermined number of times in a row, and generate the serial pipe input control signal SPIN (not illustrated) and N serial pipe output control signals SPOUT<0:6>. The serialization control unit 310 may select at least one of the weak cell addresses WADD1<0:6> to WADD128<0:6> provided from the weak cell address storage unit 210 and output the selected address as the target weak cell address WADD<0:6>, in response to the serial pipe input control signal SPIN and the weak cell refresh mode signal W_FLAG. For example, the serialization control unit 310 may receive the pipe control signal PIPE_CTRL which is activated (N+1) times in a row, generate an (N+1)-bit signal SPOUT<0:7> which is sequentially activated, output the most significant bit (MSB, i.e., SPOUT<7>) of the (N+1)-bit signal SPOUT<0:7> as the serial pipe input control signal SPIN, and generate the other N bits excluding the MSB as the N serial pipe output control signals SPOUT<0:6>.

The serializer 330 may convert the target weak cell address WADD<0:6> into the serial weak cell address SWADD, in response to the serial pipe output control signals SPOUT<0:6>.

The strobe signal generation unit 350 may generate the strobe signal STB based on the serial pipe output control signals SPOUT<0:6>. The strobe signal generation unit 350 may perform an OR operation on the serial pipe output control signals SPOUT<0:6> to generate the strobe signal STB which is activated N times. Since the strobe signal STB is generated based on the serial pipe output control signals SPOUT<0:6>, the strobe signal STB may be outputted in synchronization with the serial weak cell address SWADD.

Figure 4A:
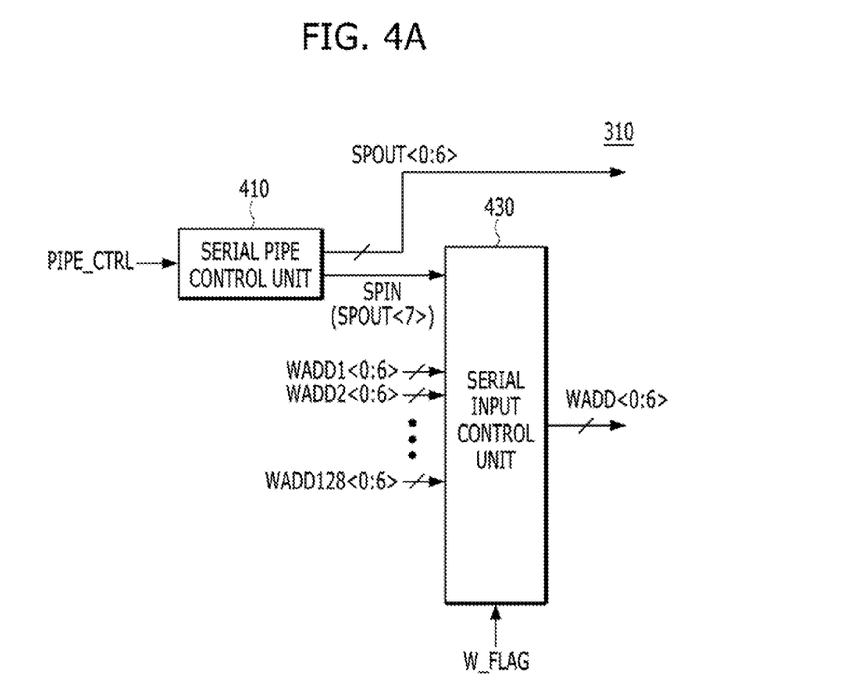
FIG. 4A is a detailed diagram illustrating of a serialization control unit shown in FIG. 3.
Figure 4B:
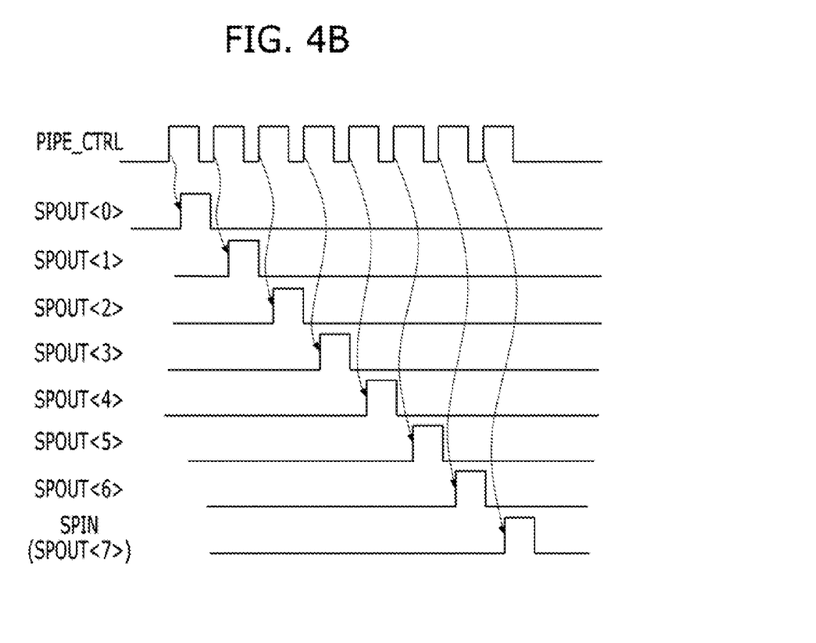
FIG. 4B is a timing diagram for describing an operation of the serialization control unit shown in FIG. 4A, according to an embodiment of the invention.

FIG. 4A is a detailed diagram illustrating the serialization control unit 310 shown in FIG. 3, and FIG. 4B is a timing diagram for describing an operation of the serialization control unit 310 shown in FIG. 4A.

Referring to FIG. 4A, the serialization control unit 310 may include a serial pipe control unit 410 and a serial input control unit 430.

The serial pipe control unit 410 may receive the pipe control signal PIPE_CTRL which is activated (N+1) times in a row, generate the (N+1)-bit signal SPOUT<0:7> which is sequentially activated, and output the MSB (SPOUT<7>) of the (N+1)-bit signal SPOUT<0:7> as the serial pipe input control signal SPIN. That is, referring to FIG. 4B, when the pipe control signal PIPE_CTRL which is activated (N+1) times in a row is inputted, the serial pipe control unit 410 may generate the N serial pipe output control signals SPOUT<0:6> in response to the first to Nth activations of the pipe control signal PIPE_CTRL, and generate the serial pipe input control signal SPIN in response to the last activation or the (N+1)th activation.

The serial input control unit 430 may select at least one of the weak cell addresses WADD1<0:6> to WADD128<0:6> provided from the weak cell address storage unit 210 and output the selected address as the target weak cell address WADD<0:6>, in response to the serial pipe input control signal SPIN and the weak cell refresh mode signal W_FLAG.

Figure 4C:
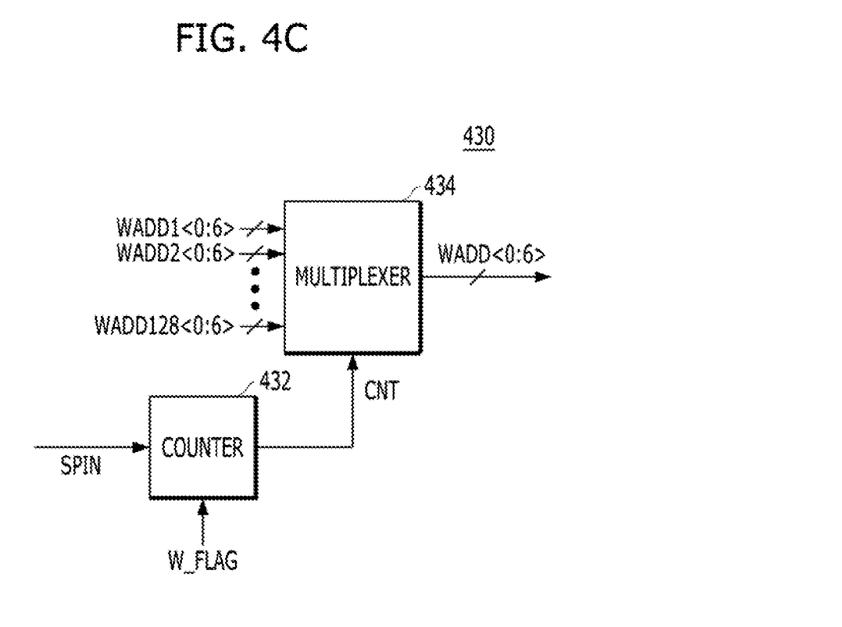
FIG. 4C is a detailed diagram illustrating a serial input control unit shown in FIG. 4A.

FIG. 4C is a detailed block diagram illustrating the serial input control unit 430 shown in FIG. 4A.

Referring to FIG. 4C, the serial input control unit 430 may include a counter 432 and a multiplexer 434.

The counter 432 may be reset when the weak cell refresh mode signal W_FLAG is deactivated, and generate a counting signal CNT by counting the serial pipe input control signal SPIN inputted thereto. That is, the counter 432 may reset the counting signal CNT at the point of time that the weak cell refresh mode is ended. The multiplexer 434 may select at least one of the weak cell addresses WADD1<0:6> to WADD128<0:6> provided from the weak cell address storage unit 210 and output the selected address as the target weak cell address WADD<0:6>, in response to the counting signal CNT.

Figure 5:
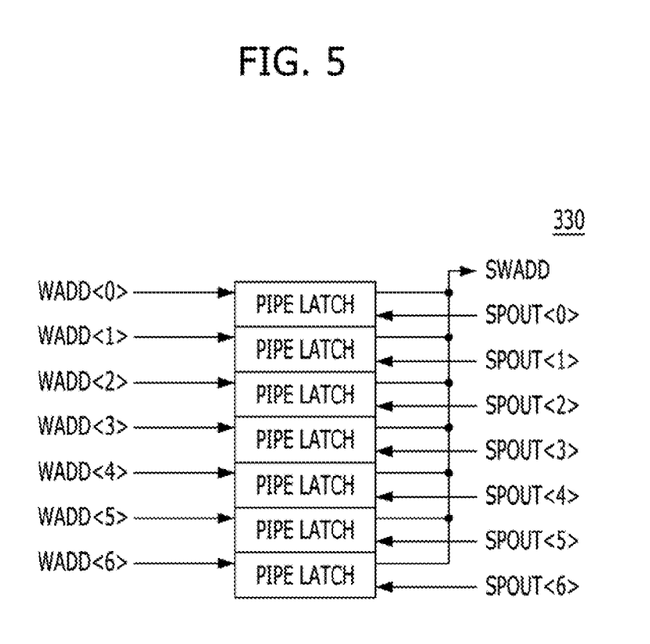
FIG. 5 is a detailed diagram illustrating a serializer shown in FIG. 3.

Referring now to FIG. 5, according to an embodiment, the serializer 330 of FIG. 3, may include a plurality of pipe latches for storing the target weak cell address WADD<0:6> inputted thereto, and outputting the stored address as the serial weak cell address SWADD in response to the serial pipe output control signal SPOUT<0:6>.

When the pipe control signal PIPE_CTRL which is activated (N+1) times in a row is inputted, the serialization unit 230 may convert the stored target weak cell address WADD<0:6> into the serial weak cell address SWADD in response to the first to Nth activations of the pipe control signal PIPE_CTRL, and select and store the next target weak cell address WADD<0:6> in response to the last activation or the (N+1)th activation.

Figure 6:
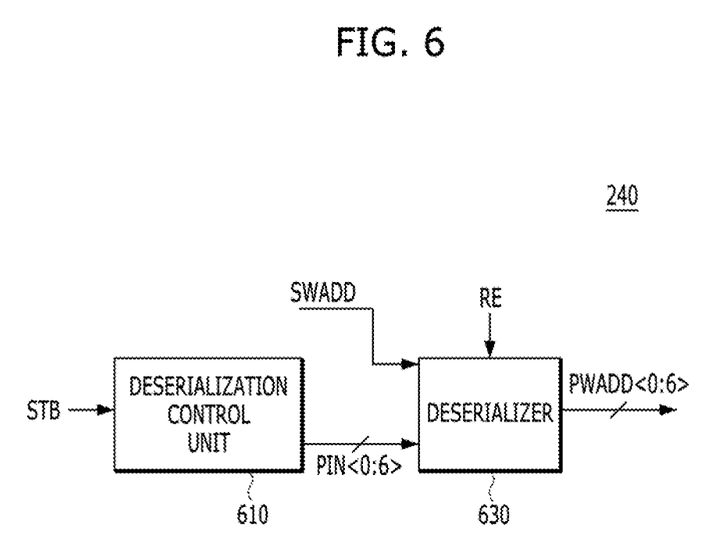
FIG. 6 is a detailed diagram illustrating a deserialization unit shown in FIG. 2.

FIG. 6 is a detailed diagram illustrating the deserialization unit 240 shown in FIG. 2.

Referring to FIG. 6, the deserialization unit 240 may include a deserialization pipe control unit 610 and a deserializer 630.

The deserialization pipe control unit 610 may receive the strobe signal STB transmitted from the serialization unit 230 of FIG. 2, and generate N parallel pipe input control signals PIN<0:6>.

The deserializer 630 may store the serial weak cell address SWADD transmitted from the serialization unit 230 in response to the parallel pipe input control signal PIN<0:6>, and output the stored serial weak cell address SWADD as the N-bit parallel weak cell address PWADD<0:6> in response to the refresh end signal RE.

Figure 7:
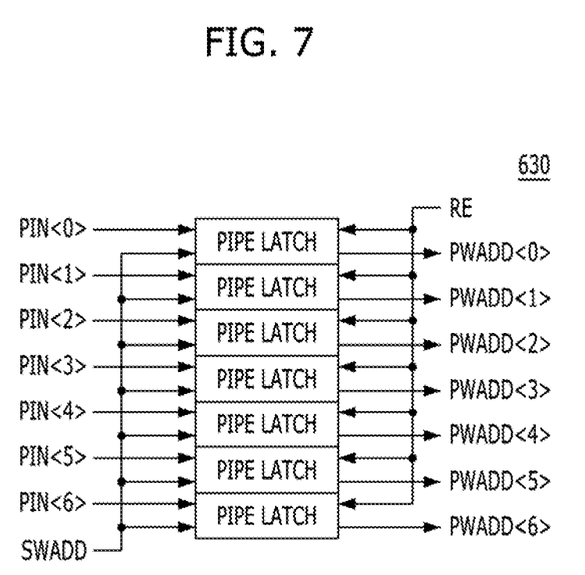
FIG. 7 is a detailed diagram illustrating a de-serializer shown in FIG. 6.

FIG. 7 is a detailed block diagram illustrating a deserializer 630 shown in FIG. 6.

Referring to FIG. 7, the deserializer 630 may include N pipe latches which store the serial weak cell address SWADD transmitted from the serialization unit 230 in response to the parallel pipe input control signal PIN<0:6>, and output the stored serial weak cell address SWADD as the N-bit parallel weak cell address PWADD<0:6> in response to the refresh end signal RE.

When the strobe signal STB synchronized with the serial weak cell address SWADD is inputted from the serialization unit 230, the deserialization unit 240 may generate the N parallel pipe input control signals PIN<0:6> which are sequentially activated based on the strobe signal STB, and store the serial weak cell address SWADD in response to the N parallel pipe input control signals PIN<0:6>. Then, the deserialization unit 240 may output the stored address as the parallel weak cell address PWADD<0:6>, in response to the refresh end signal RE which is activated when the corresponding refresh mode is ended.

Figure 8:
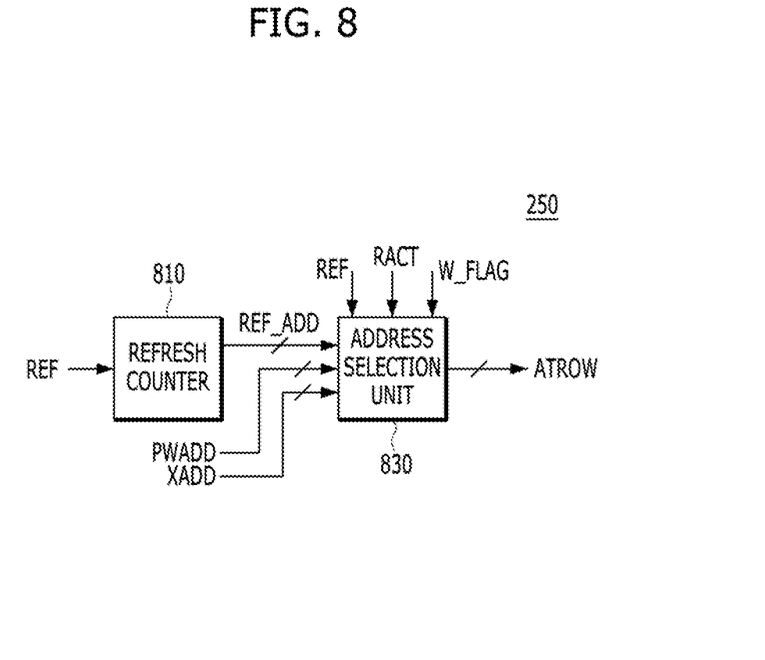
FIG. 8 is a detailed diagram illustrating a refresh control unit shown in FIG. 2.

FIG. 8 is a detailed diagram illustrating the refresh control unit 250 shown in FIG. 2.

Referring to FIG. 8, the refresh control unit 250 may include a refresh counter 810 and an address selection unit 830.

The refresh counter 810 may generate a refresh address REF_ADD by counting the refresh signal REF. The address selection unit 830 may select at least one of the parallel weak cell address PWADD converted through the deserialization unit 240 of FIG. 2, the refresh address REF_ADD, and the row address XADD for a normal operation and output the selected address as the target row address ATROW, in response to the weak cell refresh mode signal W_FLAG, the refresh signal REF, and the word line active command RACT.

Hereafter, referring to FIG. 8, the refresh operation of the memory device will be described as follows. It is assumed that the normal refresh mode for 512 word lines and the weak cell refresh mode for 128 word lines are alternately performed during the refresh operation.

First, when the memory device enters the normal refresh mode, the refresh signal REF may be activated, and the weak cell refresh mode signal W_FLAG may be deactivated. The refresh counter 810 may generate the refresh address REF_ADD<0:7> by counting the refresh signal REF, and the address selection unit 830 may output the refresh address REF_ADD<0:7> as the target row address ATROW in response to the activated refresh signal REF and the deactivated weak cell refresh mode signal W_FLAG. Thus, a normal refresh operation is performed on the memory cell array (not illustrated) coupled to 512 word lines (not illustrated) corresponding to the target row address ATROW.

After the normal refresh operation is performed on the 512 word lines, the memory device may enter the weak cell refresh mode. Thus, the weak cell refresh mode signal W_FLAG may be activated, and the refresh signal REF may also be activated. The address selection unit 830 may output the parallel weak cell address PWADD<0:6> as the target row address ATROW in response to the weak cell refresh mode signal W_FLAG and the refresh signal REF. Therefore, one more refresh operation may be performed on weak cells coupled to 128 word lines corresponding to the target row address ATROW.

As the memory device alternately enters the normal refresh mode or the weak cell refresh mode, at least one or more refresh operations may be performed on a weak cell having a data retention time shorter than the refresh cycle, in addition to the normal refresh operations, which makes it possible to prevent a data loss.

Figure 9:
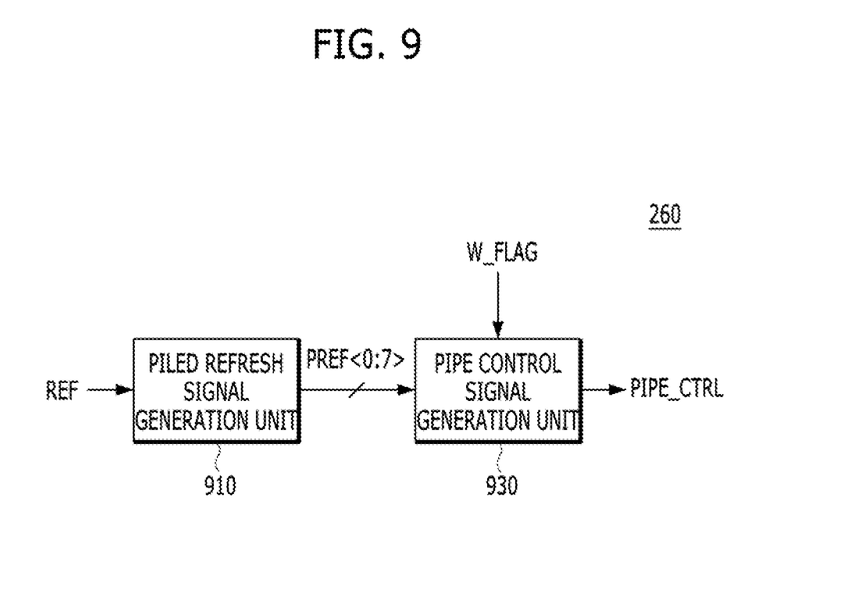
FIG. 9 is a detailed diagram illustrating a pipe control unit shown in FIG. 2.

Referring now to FIG. 9, the pipe control unit 260 of FIG. 2 may include a piled refresh signal generation unit 910 and a pipe control signal generation unit 930, according to an embodiment of the invention.

The piled refresh signal generation unit 910 may receive the refresh signal REF, and generate (N+1) piled refresh signals PREF<0:7> which are delayed by a predetermined time and sequentially activated.

Figure 10:
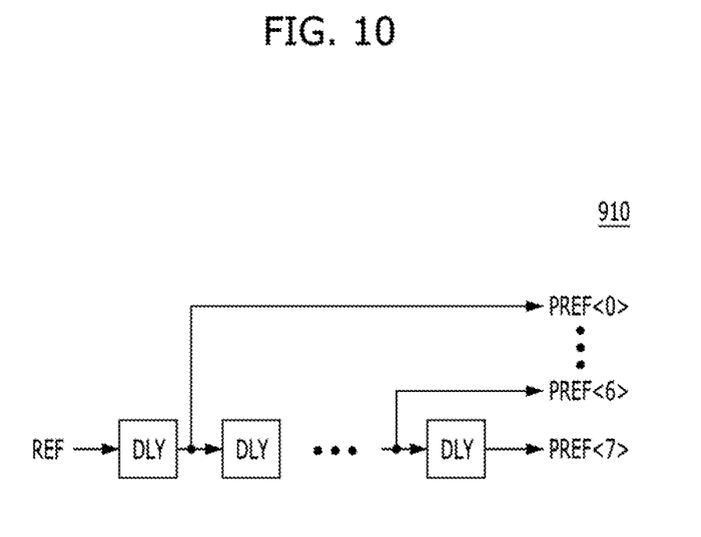
FIG. 10 is a detailed diagram illustrating a plied refresh signal generation unit shown in FIG. 9.

FIG. 10 illustrates a detailed configuration for the piled refresh signal generation unit 910 shown in FIG. 9, according to an embodiment of the invention. Referring to FIG. 10, the piled refresh signal generation unit 910 may include first to (N+1)th delay units coupled in series. The first delay unit may receive the refresh signal REF, and outputs of the respective delay units may become the (N+1) piled refresh signals PREF<0:7>.

The pipe control signal generation unit 930 may receive the piled refresh signals PREF<0:7> and generate the pipe control signal PIPE_CTRL which is activated (N+1) times, in response to the weak cell refresh mode signal W_FLAG. The pipe control signal generation unit 930 may perform an OR operation on the piled refresh signals PREF<0:7> to output the pipe control signal PIPE_CTRL, during a period in which the memory device enters the weak cell refresh mode to activate the weak cell refresh mode signal W_FLAG.

Figure 11:
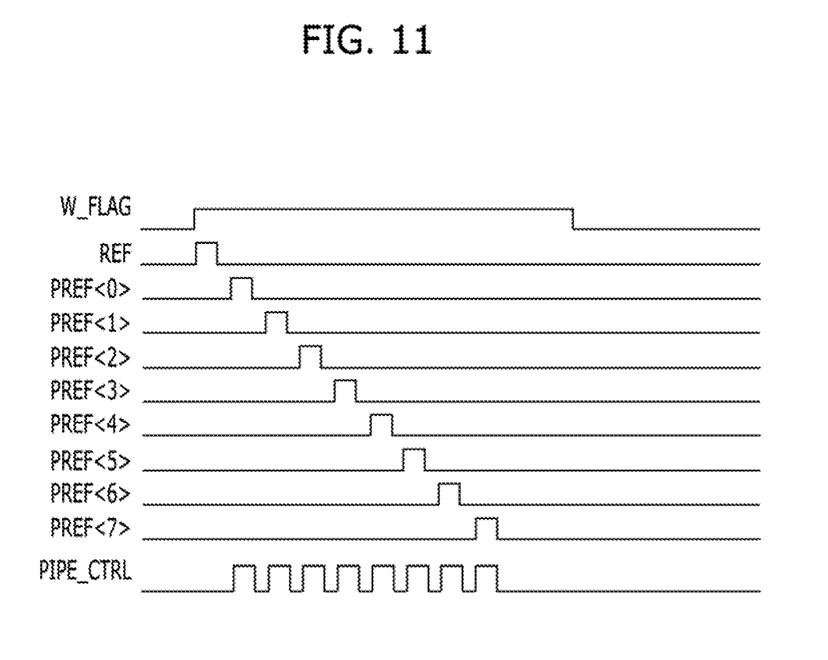
FIG. 11 is a timing diagram for describing an operation of the pipe control unit shown in FIG. 9, according to an embodiment of the invention.

FIG. 11 is a timing diagram for describing an operation of the pipe control unit 260 shown in FIG. 9, according to an embodiment of the invention. Referring to FIG. 11, when the memory device enters the weak cell refresh mode, the weak cell refresh mode signal W_FLAG may be activated, and the refresh signal REF may also be activated. Then, the piled refresh signal generation unit 910 may generate the (N+1) piled refresh signals PREF<0:7> which are sequentially activated in response to the activated refresh signal REF. When the piled refresh signals PREF<0:7> are inputted, the pipe control signal generation unit 930 may perform an OR operation on the piled refresh signals PREF<0:7> to generate the pipe control signal PIPE_CTRL which is activated (N+1) times.

Figure 12:
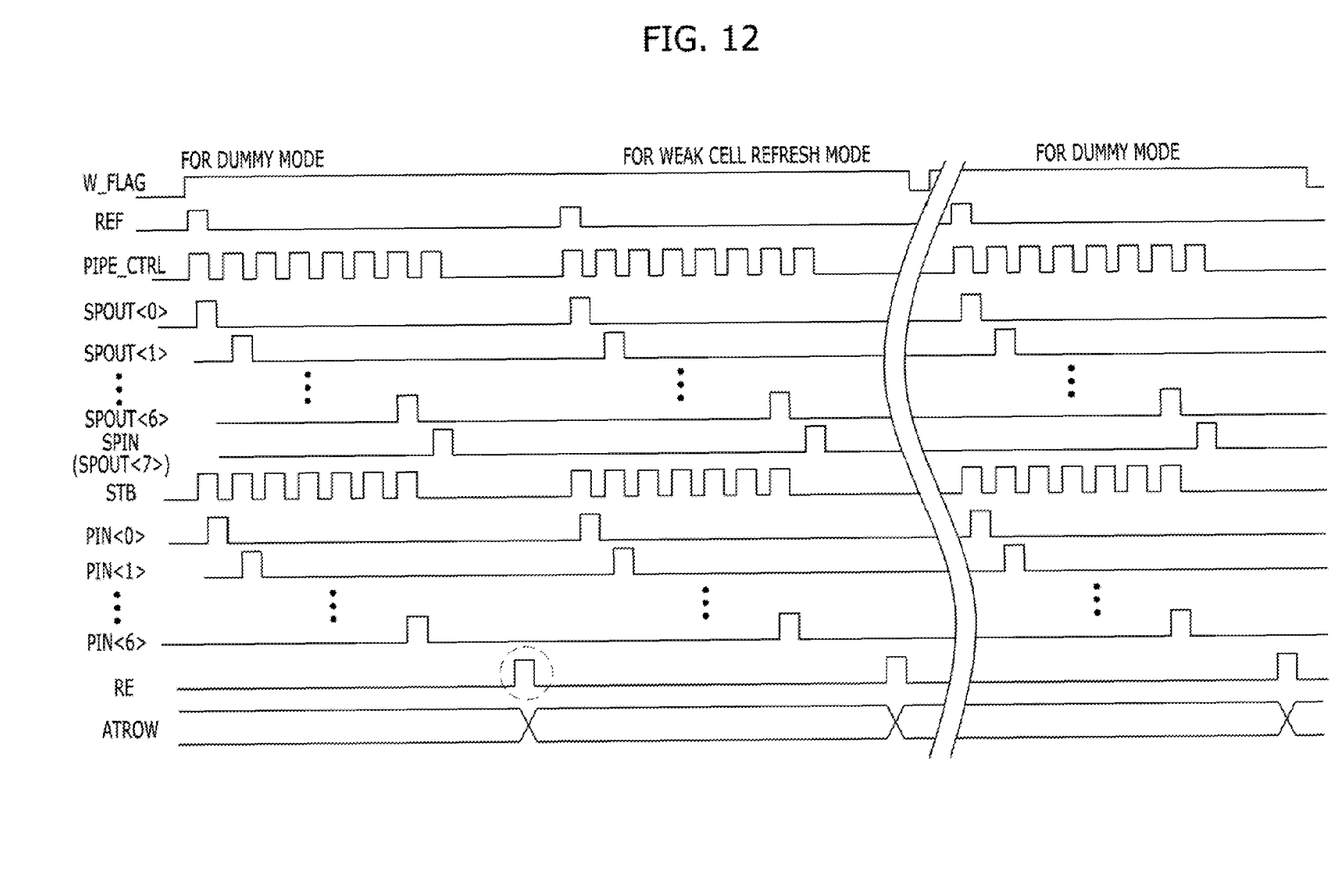
FIG. 12 is a timing diagram for describing an operation of a stacked memory device shown in FIGS. 1 to 11, according to an embodiment of the invention.

FIG. 12 is a timing diagram for describing an operation of a stacked memory device shown in FIGS. 1 to 11, according to an embodiment of the invention.

Referring to FIGS. 1 to 12, both of the weak cell refresh mode signal W_FLAG and the refresh signal REF may be in a deactivated state at an initial stage of the operation of the stacked memory device. The counter 432 of the serialization unit 230 may reset the counting signal CNT in response to the weak cell refresh mode signal W_FLAG deactivated to a logic low level. Then, the multiplexer 434 of the serialization unit 230 may select the first weak cell address WADD1<0:6> among the weak cell addresses WADD1 to WADD128 provided from the weak cell address storage unit 210, and output the selected address as the target weak cell address WADD<0:6>. Thus, the serializer 330 of the serialization unit 230 may store the first weak cell address WADD1<0:6> as the target weak cell address WADD<0:6>.

Then, when the memory device enters the weak cell refresh mode, the weak cell refresh mode signal W_FLAG may be activated, and the refresh signal REF may also be activated during a predetermined period. The weak cell refresh mode which is performed for the first time may be performed as a dummy mode. In the dummy mode, the target weak cell address WADD<0:6> may be stored only in the serializer 330 of the serialization unit 230 and not in the deserializer 630 of the deserialization unit 240. Thus, only an operation of storing the target weak cell address WADD<0:6> stored in the serializer 330 into the deserializer 630 of the deserialization unit 240 may be performed.

More specifically, the pipe control unit 260 may receive the refresh signal REF and output the pipe control signal PIPE_CTRL which is activated (N+1) times, during the weak cell refresh mode in which the weak cell refresh mode signal W_FLAG is activated.

When the pipe control signal PIPE_CTRL which is activated (N+1) times in a row is inputted, the serialization control unit 310 of the serialization unit 230 may generate N serial pipe output control signals SPOUT<0:6> in response to the first to Nth activations of the pipe control signal PIPE_CTRL, and generate the serial pipe input control signal SPIN in response to the last activation or the (N+1)th activation. The serializer 330 of the serialization unit 230 may convert the target weak cell address WADD<0:6>, which is already stored in the dummy mode, into the serial weak cell address SWADD, in response to the serial pipe output control signals SPOUT<0:6>. Furthermore, the strobe signal generation unit 350 of the serialization unit 230 may generate the strobe signal STB based on the serial pipe output control signals SPOUT<0:6>.

Then, when the serial pipe input control signal SPIN is activated, the counter 432 of the serialization unit 230 may increase the counting signal CNT by counting the serial pipe input control signal SPIN, and the multiplexer 434 of the serialization unit 230 may select the second weak cell address WADD2<0:6> among the weak cell addresses WADD1 to WADD128 provided from the weak cell address storage unit 210, and output the selected address as the target weak cell address WADD<0:6>. That is, the serializer 330 of the serialization unit 230 may store the second weak cell address WADD2<0:6> as the target weak cell address WADD<0:6>, in response to the serial pipe input control signal SPIN.

The deserialization pipe control unit 610 of the deserialization unit 240 may receive the strobe signal STB transmitted from the serialization unit 230, and generate N parallel pipe input control signals PIN<0:6>. The deserializer 630 of the deserialization unit 240 may store the serial weak cell address SWADD transmitted from the serialization unit 230, in response to the parallel pipe input control signal PIN<0:6>. Then, when the refresh end signal RE indicating the end of the refresh mode is activated, the deserializer 630 may output the stored serial weak cell address SWADD as the N-bit parallel weak cell address PWADD<0:6>.

Then, the memory device may enter the next weak cell refresh mode, and the refresh signal REF may be reactivated during a predetermined period.

Thus, the address selection unit 830 of the refresh control unit 250 may output the N-bit parallel weak cell address PWADD<0:6> outputted from the deserializer 630 of the deserialization unit 240 in the previous dummy mode as the target row address ATROW, in response to the weak cell refresh mode signal W_FLAG and the refresh signal REF. Thus, the one more refresh operation may be performed on a weak cell coupled to a word line corresponding to the target row address ATROW.

The pipe control unit 260 may receive the refresh signal REF, and output the pipe control signal PIPE_CTRL which is activated (N+1) times, simultaneously. When the pipe control signal PIPE_CTRL which is activated (N+1) times in a row is inputted, the serialization unit 230 may convert the target weak cell address WADD<0:6> which is already stored in the dummy mode into the serial weak cell address SWADD in response to the first to Nth activations of the pipe control signal PIPE_CTRL, and store the next target weak cell address WADD<0:6> in response to the last activation or the (N+1)th activation. The deserialization unit 240 may receive the strobe signal STB transmitted from the serialization unit 230, generate N parallel pipe input control signals PIN<0:6>, and store the serial weak cell address SWADD transmitted from the serialization unit 230 in response to the parallel pipe input control signals PIN<0:6>. Then, when the refresh end signal RE indicating the end of the refresh mode is activated, the deserialization unit 240 may output the stored serial weak cell address SWADD as the N-bit parallel weak cell address PWADD<0:6>.

Then, when the memory device enters the next weak cell refresh mode and the refresh signal REF is reactivated during a predetermined period, the parallel weak cell address PWADD<0:6> that is transmitted in the previous dummy mode may be outputted as the target row address ATROW.

Thus, one more refresh operation may be performed on a weak cell coupled to a word line corresponding to the target row address ATROW.

As described above, the operation of transmitting a new weak cell address using the pipe control signal PIPE_CTRL which is consecutively activated whenever the refresh signal REF is activated may be performed at the same time as the refresh operation based on the previously received weak cell address.

The above-described weak cell refresh mode may be repeated to additionally perform one or more refresh operations on a weak cell having a data retention time shorter than the refresh cycle, in addition to a normal refresh operation. Thus, a data loss can be prevented.

As described above, the stacked memory device according to an embodiment of the present invention may reduce the density of the center region and increase the utilization efficiency of the available area, because the circuits for storing weak cell addresses are disposed in the outer region of the base die, instead of the center region.

Furthermore, the stacked memory device may reduce or minimize the number of signal lines between the center region and the outer region of the base die, because the circuits for storing weak cell addresses may be disposed in the outer region instead of the center region and the required addresses may be transmitted through the pipe circuit.

Furthermore, the stacked memory device may optimize existing circuits without adding additional circuits, because the serialization-deserialization circuit may be controlled through the piled refresh signals which may be sequentially activated to perform the piled refresh operation, when the stacked memory device is a memory device which performs the piled refresh scheme.

Although various embodiments have been described for illustrative purposes, it will be apparent to those skilled in the art that various changes and modifications may be made without departing from the spirit and or scope of the invention as defined in the following claims.

What is claimed is:

1. A stacked memory device comprising a base die and a plurality of core dies,
wherein the base die comprises:
a weak cell address storage unit suitable for storing weak cell addresses;
a serialization unit suitable for selecting at least one of the weak cell addresses provided from the weak cell address storage unit as a target weak cell address, converting the selected target weak cell address into a serial weak cell address, and outputting a strobe signal synchronized with the serial weak cell address, based on a weak cell refresh mode signal and a pipe control signal;
a deserialization unit suitable for storing the serial weak cell address based on the strobe signal, and converting the stored address into a parallel weak cell address based on a refresh end signal;
a refresh control unit suitable for selecting the parallel weak cell address or a refresh address generated based on a refresh signal, and outputting a target address for a refresh operation; and
a pipe control unit suitable for generating the pipe control signal which is activated a predetermined number of times in a row, based on the refresh signal.

2. The stacked memory device of claim 1, wherein the base die and the core dies are stacked to transmit signals through a plurality of through-chip vias.

3. The stacked memory device of claim 1, wherein the pipe control unit, the deserialization unit, and the refresh control unit are disposed in a center region of the base die, and the weak cell address storage unit and the serialization unit are disposed in an outer region of the base die.

4. The stacked memory device of claim 1, wherein the serialization unit comprises a plurality of pipe latches suitable for storing the selected target weak cell address based on a serial pipe input control signal which is generated based on the pipe control signal, and outputting the stored address as the serial weak cell address in response to a plurality of serial pipe output control signals which are generated based on the pipe control signal.

5. The stacked memory device of claim 1, wherein the serialization unit comprises:
   a serialization control unit suitable for receiving the pipe control signal which is activated the predetermined number of times in a row, generating a serial pipe input control signal and N serial pipe output control signals, and selecting one of the weak cell addresses provided from the weak cell address storage unit as the target weak cell address in response to the serial pipe input control signal and the weak cell refresh mode signal, where N is a natural number greater than 2;
   a serializer suitable for converting the target weak cell address into the serial weak cell address, in response to the serial pipe output control signals; and
   a strobe signal generation unit suitable for generating the strobe signal synchronized with the serial weak cell address in response to the serial pipe output control signals.

6. The stacked memory device of claim 5, wherein the serialization control unit comprises:
   a serial pipe control unit suitable for generating the N serial pipe output control signals in response to the first to Nth activations of the pipe control signal, and generating the serial pipe input control signal in response to the (N+1)th activation of the pipe control signal, when the pipe control signal which is activated the predetermined number of times in a row is inputted from the pipe control unit; and
   a serial input control unit suitable for selecting one of the weak cell addresses provided from the weak cell address storage unit as the target weak cell address in response to the serial pipe input control signal and the weak cell refresh mode signal.

7. The stacked memory device of claim 6, wherein the serial input control unit comprises:
   a counter reset when the weak cell refresh mode signal is deactivated, and suitable for generating a counting signal by counting the serial pipe input control signal; and
   a multiplexer suitable for selecting one of the weak cell addresses provided from the weak cell address storage unit in response to the counting signal, and outputting the selected address as the target weak cell address.

8. The stacked memory device of claim 5, wherein the strobe signal generation unit performs an OR operation on the serial pipe output control signals to generate the strobe signal which is activated N times.

9. The stacked memory device of claim 1, wherein the deserialization unit comprises a plurality of pipe latches suitable for storing the serial weak cell address in response to the plurality of parallel pipe input control signals which are generated based on the strobe signal, and outputting the parallel weak cell address in response to the refresh end signal.

10. The stacked memory device of claim 1, wherein the deserialization unit comprises:
    a deserialization pipe control unit suitable for receiving the strobe signal and generating N parallel pipe input control signals, where N is a natural number greater than 2; and
    a deserializer suitable for converting the serial weak cell address into the parallel weak cell address in response to the parallel pipe input control signals and the refresh end signal.

11. The stacked memory device of claim 1, wherein the pipe control unit comprises:
    a piled refresh signal generation unit suitable for receiving the refresh signal, and generating (N+1) piled refresh signals which are delayed by a predetermined time and sequentially activated; and
    a pipe control signal generation unit suitable for generating the pipe control signal which is activated (N+1) times, based on the piled refresh signals, in response to the weak cell refresh mode signal.

12. The stacked memory device of claim 11, wherein the piled refresh signal generation unit comprises first to (N+1)th delay units coupled in series, and
    the first delay unit receives the refresh signal, and outputs of the respective delay units are the (N+1) piled refresh signals.

13. The stacked memory device of claim 11, wherein the pipe control signal generation unit generates the pipe control signal by performing an OR operation on the piled refresh signals, during a period in which the weak cell refresh mode signal is activated.

14. The stacked memory device of claim 1, wherein the refresh control unit comprises:
    a refresh counter suitable for generating the refresh address by counting the refresh signal; and
    an address selection unit suitable for outputting one of the refresh address and the weak cell address as the target address in response to the refresh signal and the weak cell refresh mode signal.

15. The stacked memory device of claim 1, wherein the weak cell address storage unit comprises:
    a weak cell address fuse unit comprising a plurality of fuses for programming weak cell address information, and suitable for outputting the programmed weak cell address information; and
    a fuse information storage unit suitable for storing the weak cell address information provided from the weak cell address fuse unit as the weak cell addresses.

16. A stacked memory device comprising a base die and a plurality of core dies,
    wherein the base die comprises:
    a weak cell address storage unit suitable for storing weak cell address information;
    a pipe control unit suitable for generating a pipe control signal using piled refresh signals for a piled refresh operation;
    a serialization unit suitable for converting a weak cell address stored in the weak cell address storage unit into a serial weak cell address, and outputting a strobe signal synchronized with the serial weak cell address, based on the pipe control signal;
    a deserialization unit suitable for storing the serial weak cell address based on the strobe signal, and converting the stored address into a parallel weak cell address based on a refresh end signal; and a refresh control unit suitable for outputting the parallel weak cell address or a refresh address as a target address for a refresh operation.

17. The stacked memory device of claim 16, wherein the base die and the core dies are stacked to transmit signals through a plurality of through-chip vias.

18. The stacked memory device of claim 16, wherein the pipe control unit, the deserialization unit, and the refresh control unit are disposed in a center region of the base die, and the weak cell address storage unit and the serialization unit are disposed in an outer region of the base die.

19. A memory system comprising:
a controller die; and
a stacked memory device comprising a base die and a plurality of core dies,
wherein the base die comprises:
a weak cell address storage unit suitable for storing weak cell address information;
a serialization unit suitable for converting a weak cell address stored in the weak cell address storage unit into a serial weak cell address, and outputting a strobe signal synchronized with the serial weak cell address, based on a pipe control signal which is sequentially activated based on a refresh signal;
a deserialization unit suitable for storing the serial weak cell address in response to the strobe signal, and converting the stored address into a parallel weak cell address based on a refresh end signal; and
a refresh control unit suitable for outputting the parallel weak cell address or a refresh address as a target address for a refresh operation.

20. The memory system of claim 19, wherein the base die and the core dies are stacked to transmit signals through a plurality of through-chip vias.

\* \* \* \* \*